United States Patent
Ruiz et al.

(10) Patent No.: US 12,360,148 B2
(45) Date of Patent: Jul. 15, 2025

(54) EMBEDDED VEHICLE TRAILER CIRCUIT TESTER

(71) Applicant: Ford Global Technologies, LLC, Dearborn, MI (US)

(72) Inventors: J. Elias Ruiz, Atizapan (MX); Alba Bautista, Atizapan de Zaragoza (MX); Veronica Garza, Naucalpan de Juarez (MX); Ivan Cabrera, Cholula (MX)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 741 days.

(21) Appl. No.: 17/720,691

(22) Filed: Apr. 14, 2022

(65) Prior Publication Data

US 2023/0333152 A1    Oct. 19, 2023

(51) Int. Cl.
*G01R 31/00* (2006.01)
*H01R 29/00* (2006.01)

(52) U.S. Cl.
CPC .......... *G01R 31/006* (2013.01); *H01R 29/00* (2013.01); *H01R 2201/26* (2013.01)

(58) Field of Classification Search
CPC .... G01R 31/006; G01R 31/007; G01R 31/44; G01R 31/2806; G01R 31/282; H01R 29/00; H01R 2201/26
USPC ........................................................ 324/504
See application file for complete search history.

(56) References Cited

U.S. PATENT DOCUMENTS

| | | | | |
|---|---|---|---|---|
| 3,737,767 A * | 6/1973 | Slutsky | ................ | G01R 31/006 324/504 |
| 5,677,667 A * | 10/1997 | Lesesky | ................ | B60T 17/043 439/35 |
| 5,693,985 A * | 12/1997 | Gee | .......................... | B60D 1/62 340/3.1 |
| 5,854,517 A * | 12/1998 | Hines | .................... | B60T 8/1708 340/12.32 |
| 5,905,433 A * | 5/1999 | Wortham | ................ | G07C 5/008 340/3.4 |
| 5,990,788 A | 11/1999 | Syracuse | | |
| 6,535,113 B1 | 3/2003 | Gravolin | | |
| 7,081,813 B2 * | 7/2006 | Winick | ................ | B60R 25/1004 701/1 |
| 7,123,136 B2 * | 10/2006 | Sugimoto | .............. | G01R 15/04 340/657 |
| 7,339,465 B1 | 3/2008 | Cheng et al. | | |
| 7,345,579 B2 | 3/2008 | Nelson et al. | | |

(Continued)

FOREIGN PATENT DOCUMENTS

| | | |
|---|---|---|
| AU | 719780 B2 | 9/2013 |
| DE | 10006490 A1 | 8/2001 |

(Continued)

*Primary Examiner* — Christopher P McAndrew
(74) *Attorney, Agent, or Firm* — Frank Lollo; Brooks Kushman P.C.

(57) ABSTRACT

A trailer test module of a vehicle is electrically connected between a trailer tow electrical connector of the vehicle and a wiring harness of the vehicle that carries electrical signals for a trailer such that when the electrical connector of the trailer is attached to the trailer tow electrical connector, the trailer tow electrical connector is between the trailer test module and the electrical connector of the trailer. The trailer test module includes circuitry that replicates an electrical load of the trailer.

20 Claims, 2 Drawing Sheets

(56) References Cited

U.S. PATENT DOCUMENTS

| | | | | |
|---|---|---|---|---|
| 7,712,760 B2* | 5/2010 | Ohtomo | ................ | B60W 20/50 |
| | | | | 280/439 |
| 7,746,219 B1* | 6/2010 | Paul | ....................... | B60Q 1/305 |
| | | | | 340/431 |
| 7,777,495 B2* | 8/2010 | Mannerfelt | ............ | H05B 47/21 |
| | | | | 324/504 |
| 7,906,973 B1* | 3/2011 | Orr | ......................... | H04L 43/50 |
| | | | | 324/543 |
| 8,185,264 B2* | 5/2012 | Carroll | ................ | B61L 15/0027 |
| | | | | 701/19 |
| 9,834,133 B2* | 12/2017 | Bean | ..................... | B60Q 1/305 |
| 11,364,885 B2* | 6/2022 | Viele | ..................... | B60T 8/1708 |
| 2005/0187677 A1 | 8/2005 | Walker | | |
| 2006/0026017 A1 | 2/2006 | Walker | | |
| 2007/0079012 A1 | 4/2007 | Walker | | |
| 2008/0091309 A1 | 4/2008 | Walker | | |
| 2008/0231285 A1* | 9/2008 | Curtis | .................... | B60Q 1/305 |
| | | | | 324/504 |
| 2011/0265025 A1* | 10/2011 | Bertness | ................ | G01R 31/58 |
| | | | | 324/426 |
| 2013/0221970 A1 | 8/2013 | Miller et al. | | |
| 2013/0229185 A1 | 9/2013 | Filio et al. | | |
| 2016/0035156 A1* | 2/2016 | Andrus | ................ | G07C 5/0808 |
| | | | | 701/34.4 |
| 2017/0285084 A1 | 10/2017 | Johnson | | |
| 2019/0217831 A1 | 7/2019 | Viele | | |
| 2019/0233034 A1 | 8/2019 | Viele et al. | | |
| 2020/0171901 A1* | 6/2020 | Pampattiwar | .......... | B60Q 1/305 |
| 2020/0294401 A1 | 9/2020 | Kerecsen | | |
| 2021/0129746 A1* | 5/2021 | Deichsel | ................ | H05B 45/14 |
| 2021/0141030 A1* | 5/2021 | Mangell | ................ | G01R 31/006 |
| 2021/0281030 A1* | 9/2021 | Hahn | ................... | H01R 13/447 |

FOREIGN PATENT DOCUMENTS

| | | |
|---|---|---|
| DE | 20320506 U1 | 12/2004 |
| DE | 102014001834 A1 | 8/2014 |
| DE | 202014104009 U1 | 10/2014 |
| DE | 202019002114 U1 | 7/2019 |
| EP | 3660526 A1 | 6/2020 |
| JP | 2016024958 A | 2/2016 |
| JP | 6093330 B2 | 3/2017 |
| WO | 9424577 A1 | 10/1994 |
| WO | 2012040774 A1 | 4/2012 |
| WO | 2014161871 A1 | 10/2014 |

* cited by examiner

EMBEDDED VEHICLE TRAILER CIRCUIT TESTER

TECHNICAL FIELD

This disclosure relates to automotive electrical systems.

BACKGROUND

Certain vehicles may include trailer tow equipment. Trailers connected thereto may include electrical equipment requiring power.

SUMMARY

An electrical system of a vehicle includes a trailer tow electrical connector that receives an electrical connector of a trailer, and a trailer test module electrically connected between the trailer tow electrical connector and a wiring harness of the vehicle that carries electrical signals for the trailer such that when the electrical connector of the trailer is attached to the trailer tow electrical connector, the trailer tow electrical connector is between the trailer test module and the electrical connector of the trailer. The trailer test module includes circuitry configured to replicate an electrical load of the trailer.

A method includes, responsive to user input, directing electrical signals from a wiring harness of a vehicle to circuitry that replicates an electrical load of a trailer and that is electrically between the wiring harness and a trailer tow electrical connector that receives an electrical connector of the trailer. The method also includes, responsive to different user input, directing electrical signals from the wiring harness to the trailer tow electrical connector while bypassing the circuitry.

A vehicle includes a wiring harness that carries electrical signals for a trailer, a trailer tow electrical connector that receives an electrical connector of a trailer, and a trailer test module electrically connected between the wiring harness and trailer tow electrical connector such that when the electrical connector of the trailer is attached to the trailer tow electrical connector, the trailer tow electrical connector is between the trailer test module and the electrical connector of the trailer. The trailer test module includes a microcontroller programmed to selectively direct the electrical signals to circuitry of the vehicle configured to replicate an electrical load of the trailer or to the trailer tow electrical connector while bypassing the circuitry.

DETAILED DESCRIPTION

Figure 1:
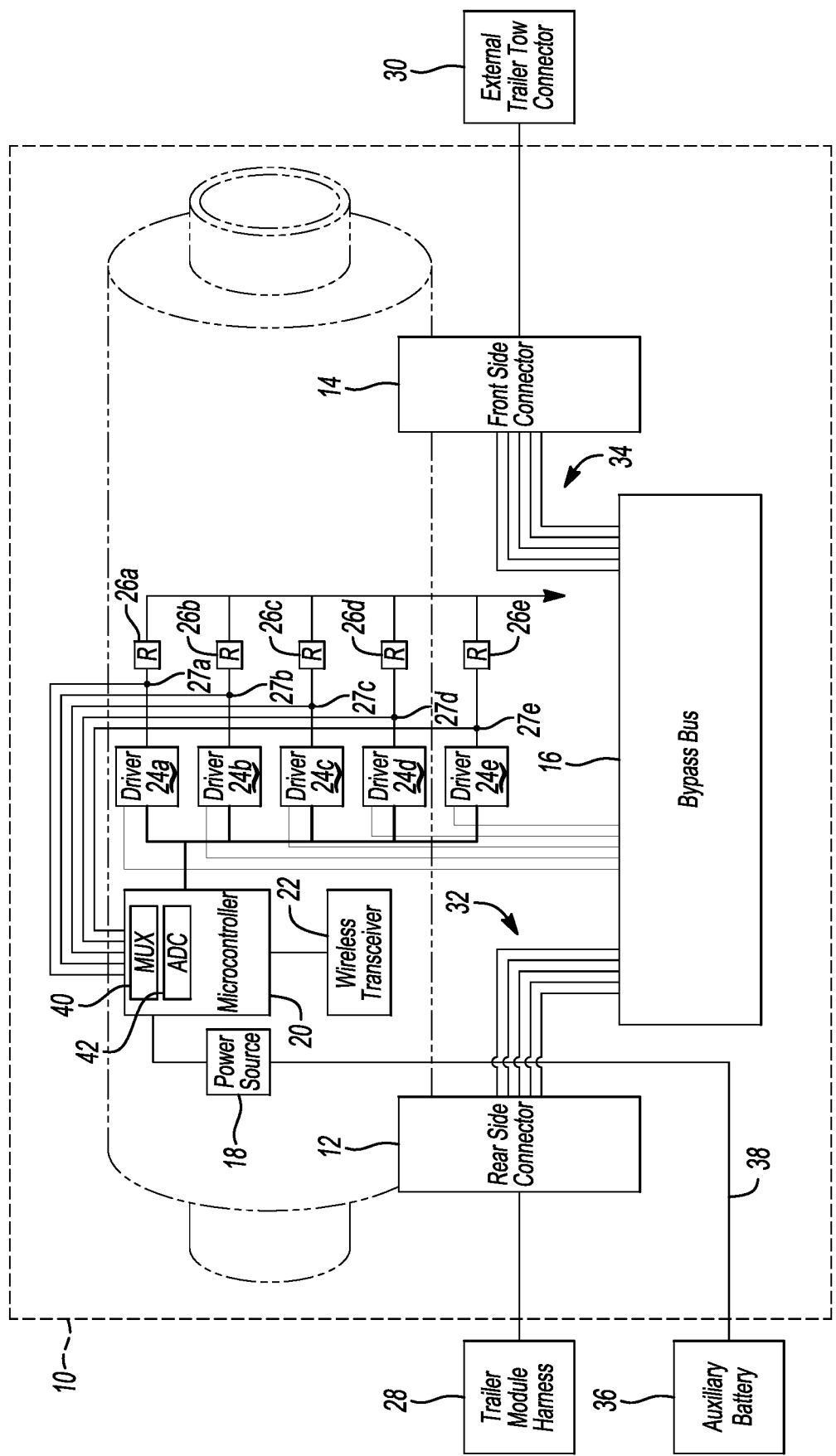
FIG. 1 is a schematic diagram of embedded trailer circuit tester circuitry.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Trailer light testers can be helpful for the towing community. They are used to verify that every electrical circuit to the trailer from the vehicle is working correctly before a trip. There are currently a variety of testers available, from simple light emitting diode (LED) plug testers to complex and multifunctional light-trailer brake devices. All of them use the same principle: They are made to be plugged in to the external trailer tow connector for testing, and removed once testing is complete.

Certain vehicles have a trailer light check feature in which a screen is displayed and customers prompted to initiate the process. The purpose of this feature is to validate trailer light functionality by turning On and Off the lights. This removes the need of two persons to verify the state of the lamps. To validate the trailer circuits, the feature requires a tester or an actual trailer to be connected.

In recent years with the increased development of smart trailer features supported by smart trailer lighting and braking modules, some traditional testers have become incompatible, due to the lack of robustness on the tester's technology, since these devices are not following the technological tendency of the controllers.

Some common testers are made from a series resistor and a low power LED, which are not compatible with the detection range offered by certain smart trailer modules. This situation can create issues for customers in that their tester may work with some trailer tow configurations but not others. Another issue is that customers may need to step out of the vehicle and perform the detection process by themselves. That is, they may need to activate the lights of interest and step out to observe whether they are indeed On.

Manufacturing facilities may also face the issue of testing trailer circuitry to ensure it is properly assembled. They may, for example, introduce a trailer tester at some point in the process by a first operator while having a second operator actuate the brakes or turn on the lights while the first operator confirms that the operation is correct. This action may not be able to be performed in every vehicle due to the time and resources necessary to maintain these operations.

One approach may be to adjust the smart trailer module detection range from a software or hardware perspective. This may not be desirable to implement because the operating environment of this device may include ice, snow, dirt, mud, and water. LEDs located therein may not tolerate such conditions well. Adjusting the range may increase the chances for false positives in the detection system, which can create other issues.

Certain smart trailer module detection systems depend on reading the resistive load offered by the trailer lights. Those values (e.g., ohms to kilo-ohms) are predefined in corresponding electronic control unit software. Here, we reformulate the tester concept by altering the manner in which the tester is implemented, increasing the usage of available technology on certain vehicles and offering a smart solution for other vehicles. Some of the proposed designs are compatible with newer and older trailer controller systems, and remove the need for aftermarket testers. Moreover, these designs may be made part of the assembly process—offering a solution to vehicles with trailer capabilities and taking advantage of current technology and how vehicle modes work.

In some examples, a new tester is proposed, which is connected inside the vehicle instead of outside the vehicle. This tester will interface the vehicle harness with the vehicle connector as an additional trailer system component. This component can be installed as part of the original manufacturing process or as an aftermarket component.

Certain proposed trailer light-check embedded testers are internal components that will interface the vehicle trailer harness and the vehicle trailer connector. They will provide a single installation process and from there, every time the user wants to check their trailer circuitry, the tester will provide the means to perform the activity without the need to exit the vehicle and without any additional assistance.

A tester, in some examples, includes two connectors each per side: A proper interface with the harness and the vehicle trailer connector. Its dimensions are designed to match the electrical interface with sufficient room to accommodate the electronic printed circuit board, which will accommodate the appropriate resistive loads and the circuitry that will provide the preselected interface with customers to activate and deactivate the tester. This arrangement may be delivered in at least two versions: one for older vehicles or low content vehicles with limited trailer feature content, and another for newer vehicles equipped with trailer light check features.

These versions (e.g., implemented in lower content vehicles without trailer light check features or implemented in higher content vehicles with trailer light check features) may operate under the same principle. The difference is related to how the tester interfaces with the customer and vehicle to activate the testing mode. Both versions may operate when the vehicle is running, the test mode is enabled, and loads are engaged. Both versions may include a bypass bus. This bus will provide a reliable connection between the vehicle and the user's trailer. When active (default), the interface is not interrupted by the tester mode and the trailer functions will operate normally.

To enter the tester mode using the first version, an application for trailer light check may be included. In this case, the application may need to interface with the tester via (but not limited) Bluetooth or other wireless standards. Once the tester mode is active, the wireless transceiver may communicate the order to the microcontroller to enable all the drivers. The drivers are fed by a specific trailer function (e.g., the right turn light circuit feeds the right turn light driver) communicating the proper circuit with the proper load. In the same manner, the reverse light circuit feeds the corresponding reverse driver, and so on.

To activate the drivers, a user may need to open the application, enable tester mode, and selectively activate the drivers by user input. When the user selects a specific soft button on their application, or from the automatic sequence from the trailer light check feature, the related microcontroller output is enabled, engaging the corresponding load. The load may be dimensioned to fit every trailer module's capabilities, from the recent to older variants. Once the load is active, the microcontroller is configured to read the voltage from the selected load. The microcontroller may include an internal multiplexor. If the microcontroller's capabilities are enhanced, a dedicated pin can be used to interact with the specific load. The multiplexor in one design may interface with the internal analog-to-digital converter to convert the measured voltage into an output for the application. The tester can provide status according to the voltage measurement. Based on the voltage levels and consistency, a color code status can be created: green, operating properly; red, not operating; yellow, some inconsistency present.

The tester electronic circuitry may be powered by an auxiliary line (12V line) coming from the vehicle. This power source may condition the voltage levels to the required power for the tester. On some smart trailer modules, this line is active only when the vehicle is On (engine need not be running) and some battery state of charge conditions are met. This means the tester will not be powered when the vehicle is Off, eliminating any potential contributor for battery drain.

The second version may work under the same principles as the first. The main differences are related to the user interface as mentioned above. In this case, the trailer light check feature and the trailer module will interact with the tester to enable the tester mode. The operation of the tester may be the same as the first version once activated. For this variant, there is no need for wireless communication with the tester since there is no remote communication between the trailer module, etc. If the capability is available, the first version can be used with proper adjustments.

These concepts need not require additional hardware. Software updates on the trailer module side to activate the tester, as well updates to the tester and other equipment, may be made. The trailer module may need to recognize a request related to tester mode. When tester mode is active, the trailer module can execute a subroutine in which it will flag a bit to enable the function. The auxiliary (e.g., 12V) relay inside the trailer module may then be enabled. The trailer module may provide a sequence of left turn and right turn activations during a period. This will provide a specific code to the sequence code reader on the tester.

When the code is read and compared with the predefined value, the tester may be in communication with the trailer module. The trailer module in this mode may exclude the trailer control function automatically and the tester may be ready to read input from the trailer light check application. There is no need to have an input from the customer. As the lamps are driven, the trailer module will feed the related driver. The operation from here will be the same at the tester level. To read the circuitry conditions, the trailer module may be able to read the voltage from the measured loads. The loads are defined within the best detection scenario. The trailer module may thus provide an accurate read on the circuitry status. The user, to turn off the tester mode, can disable the function and return to the control mode. Alternatively, the trailer module may disable the function automatically if some time passes (e.g., 60 seconds) without any action.

Referring to FIG. 1, an example trailer test module 10, which may have a cylindrical form factor, includes a rear side connector 12, a front side connector 14, and a bypass bus 16 electrically between and connecting the rear side connector 12 and front side connector 14. The trailer test module 10 also includes a power source 18, a microcontroller 20, a wireless transceiver 22, a plurality of drivers 24a, 24b, 24c, 24d, 24e, a plurality of corresponding resistors 26a, 26b, 26c, 26d, 26e, and a plurality of corresponding voltage sensors 27a, 27b, 27c, 27d, 27e.

The rear side connector 12 is configured to connect with a trailer module harness 28. The front side connector 14 is configured to connect with an external trailer tow connector 30. The trailer module harness 28, as known in the art, provides circuitry to power running lights of a trailer, reverse lights of the trailer, left turn lights of the trailer, right turn lights of the trailer, brake controller output for the trailer, and a chassis ground. The external trailer tow connector 30, as known in the art, provides an interface to corresponding circuitry of the trailer. As such, the trailer test module 10 further includes circuit lines 32 connecting the rear side connector 12 and bypass bus 16, and circuit lines 34 connecting the bypass bus 16 and front side connector 14 corresponding to the circuitry to power the running lights, reverse lights, left turn lights, right turn lights, brake controller output, and chassis ground.

During normal operation, signals from the trailer module harness 28 are carried by the rear side connector 12, circuit lines 32, bypass circuitry 16, circuit lines 34, and front side connector 14 to the external trailer tow connector 30 and circuitry of the trailer to activate and/or control the running, reverse, left turn, and right turn lights of the trailer and brakes of the trailer. That is, the bypass bus 16 prevents the signals from the trailer module harness 28 from being passed to the drivers 24a, 24b, 24c, 24d, 24e during normal operation. Switching circuitry or the like may be arranged in typical fashion to provide the selective connection necessary to direct the signals from the trailer module harness 28 to either the circuit lines 34 and front side connector 14, or the drivers 24a, 24b, 24c, 24d, 24e.

The power source 18 is connected to an auxiliary battery 36 (e.g., 12V battery) via an auxiliary line 38, and is connected to the microcontroller 20. The power source 18, as mentioned above, conditions the voltage levels for the microcontroller 20 so that it may operate the drivers 24a, 24b, 24c, 24d, 24e with the proper voltage. The wireless transceiver 22 is in communication with the microcontroller 20. It receives wireless commands from a user interface (e.g., an application on a cell phone, etc.) that instruct the microcontroller 20 to enter test mode and activate certain drivers. In this mode, signals from the trailer module harness 28 are selectively passed to the drivers 24a, 24b, 24c, 24d, 24e rather than the front side connector 14. The microcontroller 20, as mentioned above, may also include a multiplexor 40 electrically connected to an analog-to-digital converter 42.

The drivers 24a, 24b, 24c, 24d, 24e are respectively electrically connected with the bypass bus 16, and respectively electrically connected in series with the resistors 26a, 26b, 26c, 26d, 26e, which are chassis grounded. The voltage sensors 27a, 27b, 27c, 27d, 27e are arranged to detect a voltage on the connection between the corresponding driver/resistor pair, which replicate electrical loads of a trailer, and communicate the same to the microcontroller 20. Each of the resistors 26a, 26b, 26c, 26d, 26e replicates a load corresponding to running lights of a trailer (26a), reverse lights of a trailer (26b), left turn lights of a trailer (26c), right turn lights of a trailer (26d), and brake controller output for a trailer (26e). In this example, the resistance values of the resistors 26a, 26b, 26c, 26d, 26e are in the range of 25Ω to 125Ω. Other ranges, however, may be used as design requirements dictate.

As mentioned above, the microcontroller 20 may permit activation of a particular one of the drivers 24a, 24b, 24c, 24d, 24e responsive to a user command. Responsive to a request from a user to test the right turn lights of a trailer, the microcontroller 20 will direct the corresponding signal from the trailer module harness 28 on the bypass bus 16 to the driver 24d, which will output a voltage to the resistor 26d. The voltage sensor 27d will forward a signal to the multiplexor 40 corresponding to the voltage measured. The analog-to-digital converter 42 will convert this analog signal to digital format for use by the microcontroller 20, which can indicate to the user the status of the right turn light circuitry by communication of the result via the wireless transceiver 22.

In an alternative example, the element labeled 22 may instead represent a sequence coder that, responsive to input from a user to test the trailer harness module 28, puts the trailer test module 10 in test mode, and then sequentially provides signals to the drivers 24a, 24b, 24c, 24d, 24e to test the corresponding circuitry and report the same back to the user.

Figure 2:
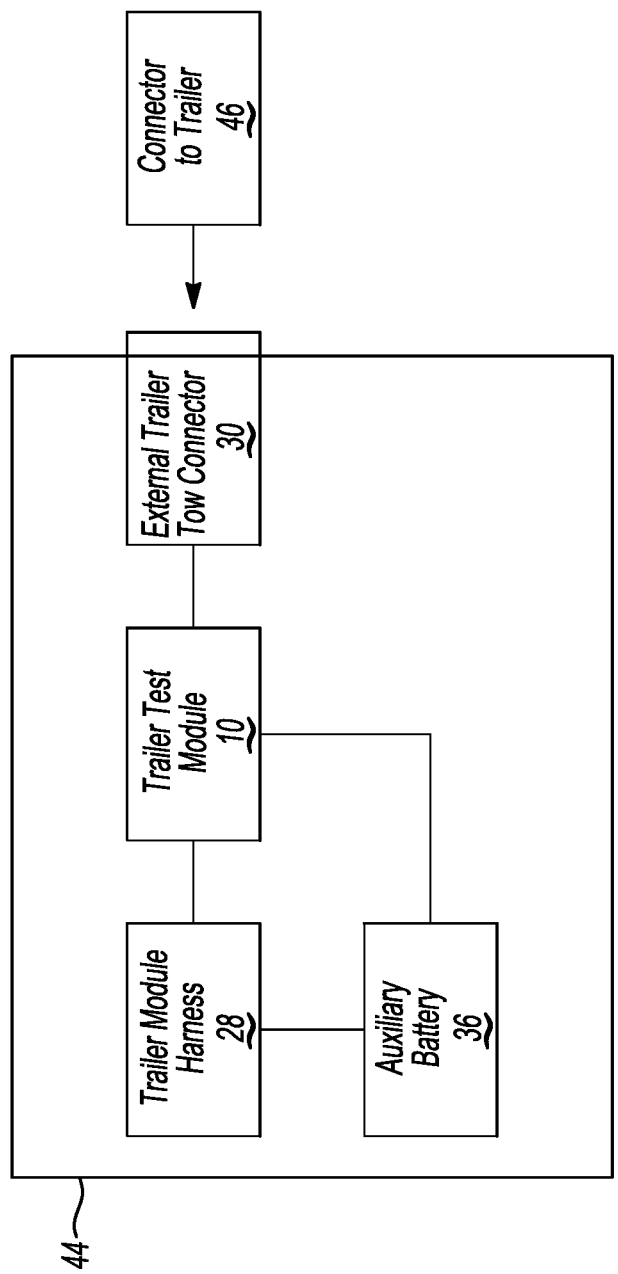
FIG. 2 is a schematic diagram of a vehicle.

Referring to FIG. 2, a vehicle 44 includes, among other things, the trailer test module 10, the trailer module harness 28, the external trailer tow connector 30, and the auxiliary battery 36. As explained above, the trailer test module 10 is electrically connected between the trailer module 28 and external tow connector 30, and is thus internal to (or integrated with) the vehicle 44. This is unlike traditional trailer tow test equipment that would be connected between the external trailer tow connector 30 and any connector to trailer 46.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. The words controller and controllers may be interchanged herein. Also, the word switch contemplates contactor(s), field effect transistor(s), and other electrical disconnect devices.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An electrical system of a vehicle comprising:
   a trailer tow electrical connector configured to receive an electrical connector of a trailer; and
   a trailer test module electrically connected between the trailer tow electrical connector and a wiring harness of the vehicle that is configured to carry electrical signals for the trailer such that when the electrical connector of the trailer is attached to the trailer tow electrical connector, the trailer tow electrical connector is between the trailer test module and the electrical connector of the trailer, wherein the trailer test module includes circuitry configured to replicate an electrical load of the trailer.

2. The electrical system of claim 1, wherein the trailer test module further includes bypass circuitry configured to carry the electrical signals to the electrical connector of the trailer when attached.

3. The electrical system of claim 2, wherein the trailer test module further includes a microcontroller programmed to selectively direct the electrical signals to the circuitry or the trailer tow electrical connector.

4. The electrical system of claim 3, wherein the microcontroller is further programmed to selectively direct the electrical signals to the circuitry responsive to user input.

5. The electrical system of claim 1, wherein the circuitry includes a plurality of drivers and corresponding resistors.

6. The electrical system of claim 5, wherein the trailer test module further includes a microcontroller programmed to sequentially activate the drivers.

7. The electrical system of claim 5, wherein some of the resistors have resistance values indicative of lights of the trailer.

8. The electrical system of claim 1, wherein the trailer test module further includes a plurality of voltage sensors configured to measure voltages associated with the circuitry.

9. A method comprising:
   responsive to user input, directing electrical signals from a wiring harness of a vehicle to circuitry (i) configured to replicate an electrical load of a trailer and (ii) electrically between the wiring harness and a trailer tow electrical connector that is configured to receive an electrical connector of the trailer; and
   responsive to different user input, directing electrical signals from the wiring harness to the trailer tow electrical connector while bypassing the circuitry.

10. The method of claim 9, wherein the circuitry further includes a plurality of drivers and corresponding resistors configured to replicate electrical loads of the trailer, further comprising, responsive to the user input, sequentially activating the drivers.

11. The method of claim 10 further comprising generating output for the user based on sensed parameters associated with the activating.

12. The method of claim 9, wherein the directing the electrical signals from the wiring harness to the trailer tow electrical connector while bypassing the circuitry only occurs when the electrical connector of the trailer is attached to the trailer tow electrical connector.

13. The method of claim 9, wherein the electrical load is associated with a light of the trailer.

14. A vehicle comprising:
   a wiring harness configured to carry electrical signals for a trailer;
   a trailer tow electrical connector configured to receive an electrical connector of the trailer; and
   a trailer test module electrically connected between the wiring harness and trailer tow electrical connector such that when the electrical connector of the trailer is attached to the trailer tow electrical connector, the trailer tow electrical connector is between the trailer test module and the electrical connector of the trailer, wherein the trailer test module includes a microcontroller programmed to selectively direct the electrical signals to circuitry of the vehicle configured to replicate an electrical load of the trailer or to the trailer tow electrical connector while bypassing the circuitry.

15. The vehicle of claim 14, wherein the trailer test module includes the circuitry.

16. The electrical system of claim 14, wherein the microcontroller is further programmed to selectively direct the electrical signals to the circuitry responsive to user input.

17. The electrical system of claim 14, wherein the circuitry includes a plurality of drivers and corresponding resistors.

18. The electrical system of claim 17, wherein the microcontroller is further programmed to sequentially activate the drivers.

19. The electrical system of claim 17, wherein some of the resistors have resistance values indicative of lights of the trailer.

20. The electrical system of claim 14, wherein the trailer test module further includes a plurality of voltage sensors configured to measure voltages associated with the circuitry.

* * * * *